(12) United States Patent
Morishita et al.

(10) Patent No.: US 11,928,408 B2
(45) Date of Patent: Mar. 12, 2024

(54) MACHINE LEARNING DEVICE, LEARNING MODEL GENERATING METHOD, INSULATION RESISTANCE ESTIMATING DEVICE, AND CONTROL DEVICE

(71) Applicant: FANUC CORPORATION, Yamanashi (JP)

(72) Inventors: Yuuki Morishita, Yamanashi-ken (JP); Toru Kobayashi, Yamanashi-ken (JP)

(73) Assignee: FANUC CORPORATION, Yamanashi (JP)

( * ) Notice: Subject to any disclaimer, the term of this patent is extended or adjusted under 35 U.S.C. 154(b) by 847 days.

(21) Appl. No.: 17/014,750

(22) Filed: Sep. 8, 2020

(65) Prior Publication Data

US 2021/0073679 A1 Mar. 11, 2021

(30) Foreign Application Priority Data

Sep. 10, 2019 (JP) .................. 2019-164313

(51) Int. Cl.
*G06F 30/27* (2020.01)
*G05B 19/4062* (2006.01)

(52) U.S. Cl.
CPC ......... *G06F 30/27* (2020.01); *G05B 19/4062* (2013.01); *G05B 2219/41* (2013.01); *G05B 2219/42152* (2013.01)

(58) Field of Classification Search
CPC ..... G06F 30/00; G06F 30/27; G05B 19/4062; G05B 2219/41; G05B 2219/42152; G06N 20/00
USPC .......................................................... 703/13
See application file for complete search history.

(56) References Cited

FOREIGN PATENT DOCUMENTS

| JP | H09251062 A | 9/1997 |
|---|---|---|
| JP | H11326429 A | 11/1999 |
| JP | 2009-060767 A | 3/2009 |
| JP | 2017173176 A | 9/2017 |
| JP | 2019138668 A | 8/2019 |

OTHER PUBLICATIONS

Brown, Jacob, "Baseline Data from Servo Motors in a Robotic Arm for Autonomous Machine Fault Diagnosis", May 2018, University of Arkansas. (Year: 2018).*
Jiang, Jean et al., "Development of a Motion Controlled Robotic Arm", 2017, IEEE. (Year: 2017).*
Tsyokhla, Igor et al., "On-Line Condition Monitoring for Diagnosis and Prognosis of Insulation Degradation of Inverter-fed Machines", Nov. 25, 2018, IEEE Transactions on Industrial Electronics, IEEE. (Year: 2018).*
Zhang, Zerui et al., "Fault Diagnosis of Servo Drive System of CNC Machine Based on Deep Learning", 2018, IEEE. (Year: 2018).*

* cited by examiner

*Primary Examiner* — Cedric Johnson
(74) *Attorney, Agent, or Firm* — Robert P. Michal, Esq.; Carter, DeLuca & Farrell LLP

(57) ABSTRACT

A machine learning device includes: a training data acquisition unit configured to acquire multiple pieces of training data each including insulation resistances of a servomotor at the beginning and the end of a certain period and time-series data indicating conditions of the servomotor in the certain period; and a learning model generating unit configured to perform a supervised learning using the training data to thereby generate a learning model.

8 Claims, 11 Drawing Sheets

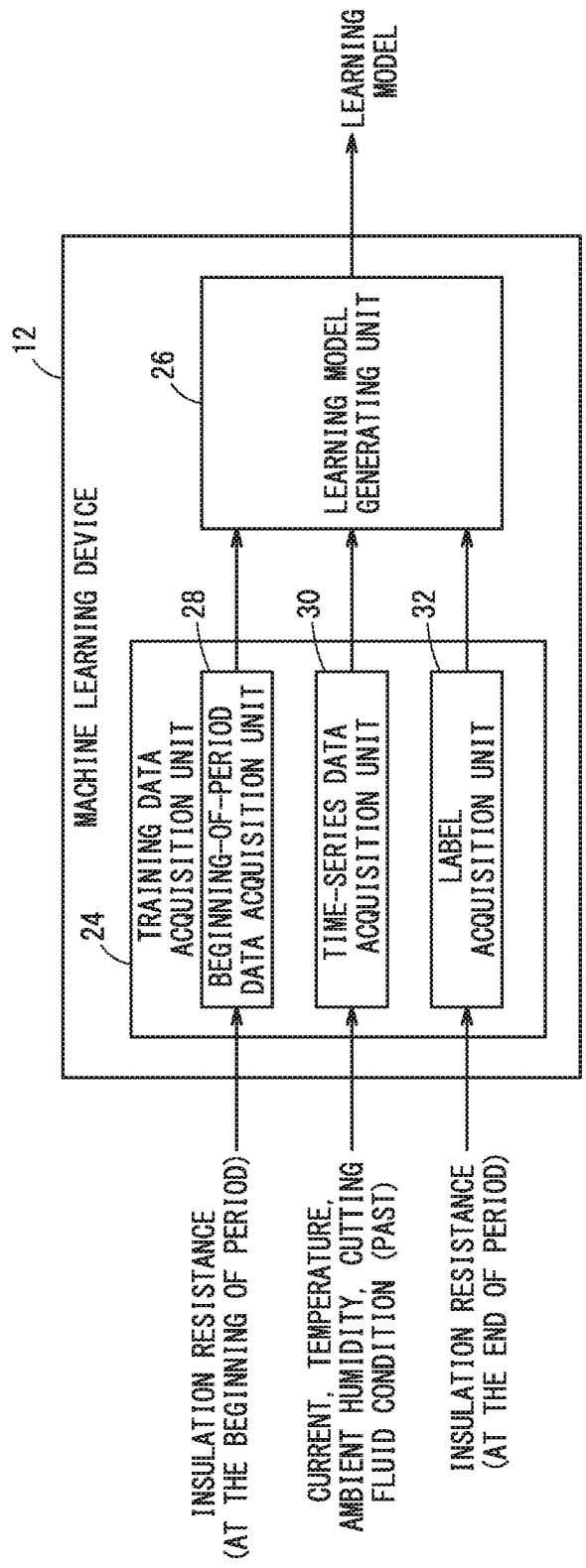

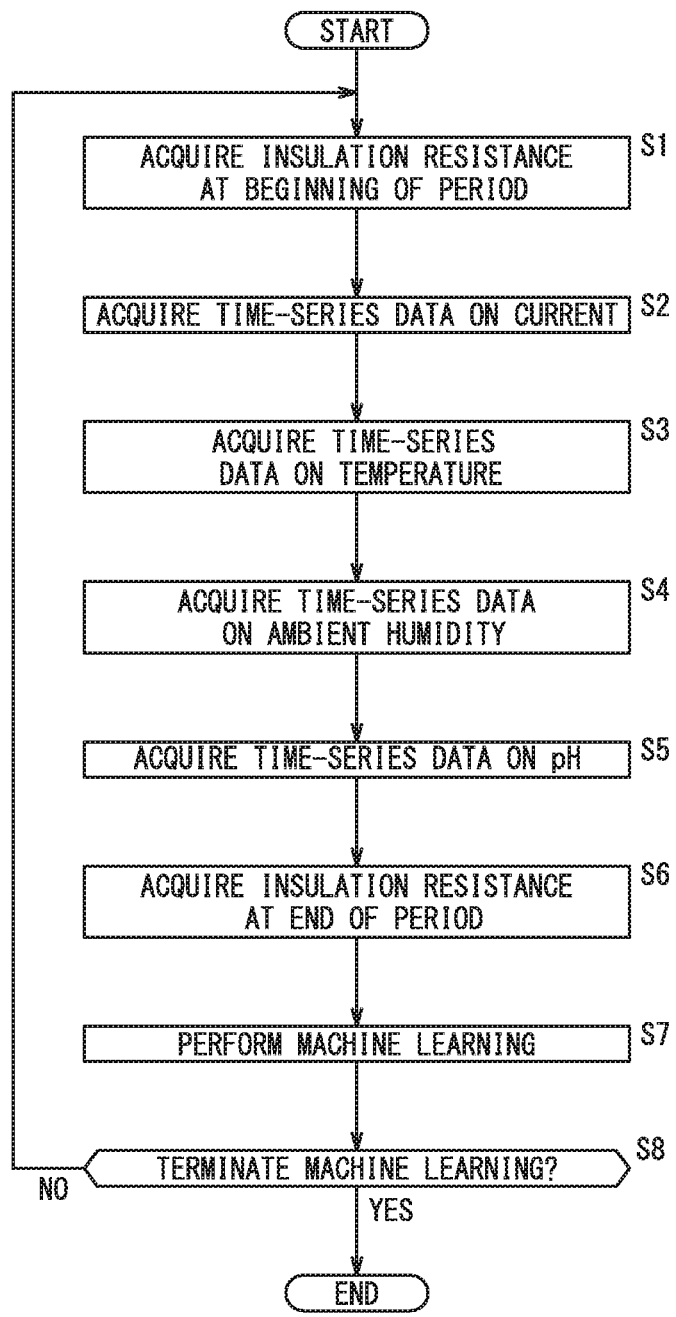

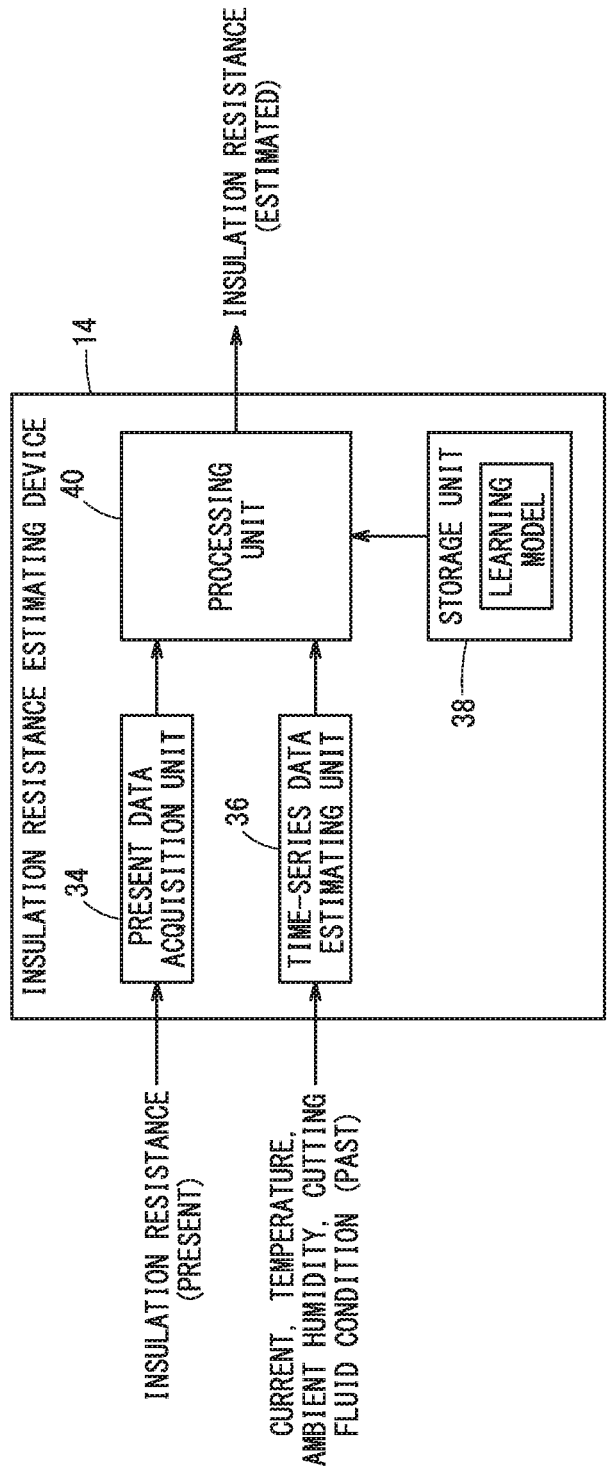

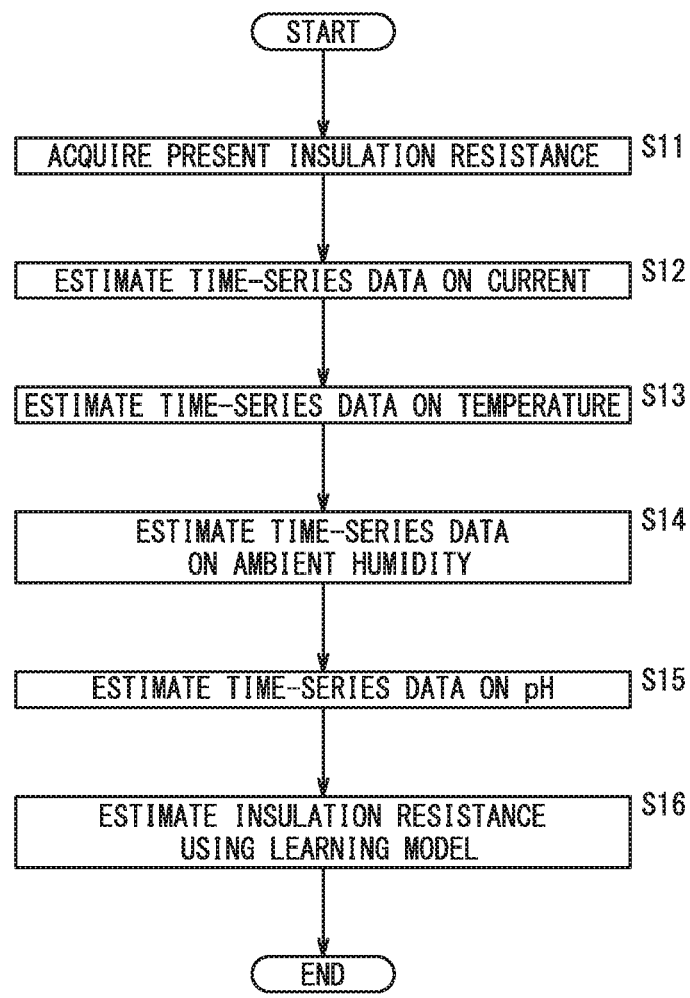

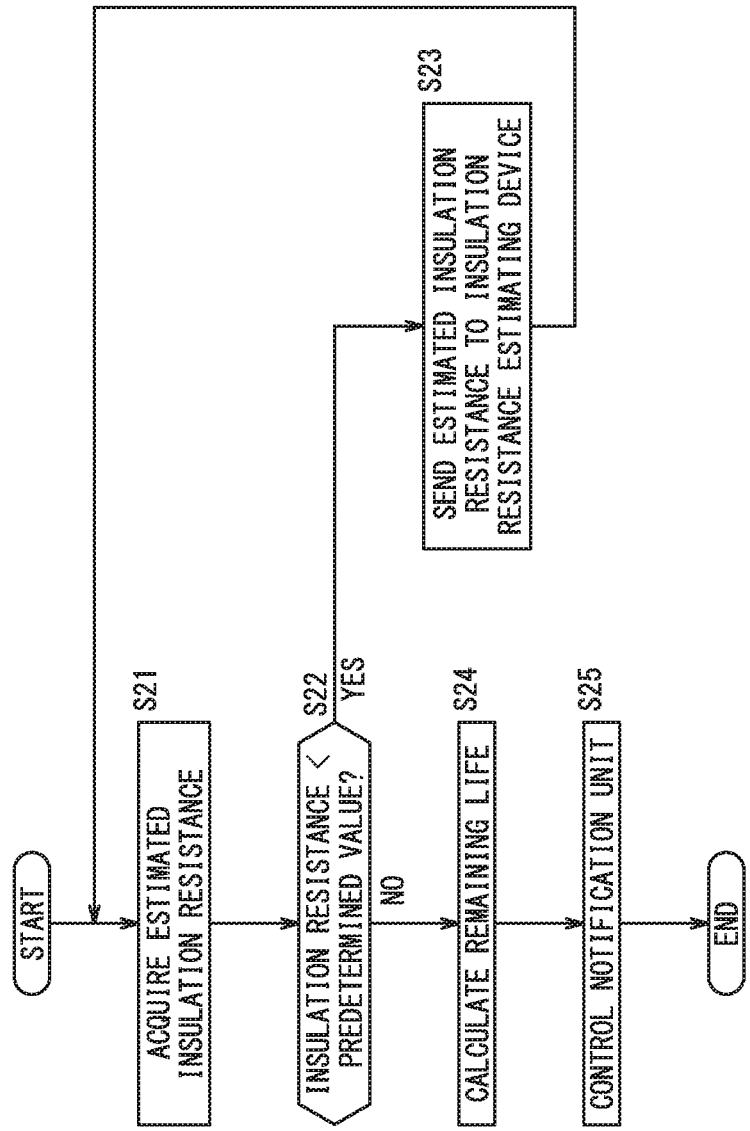

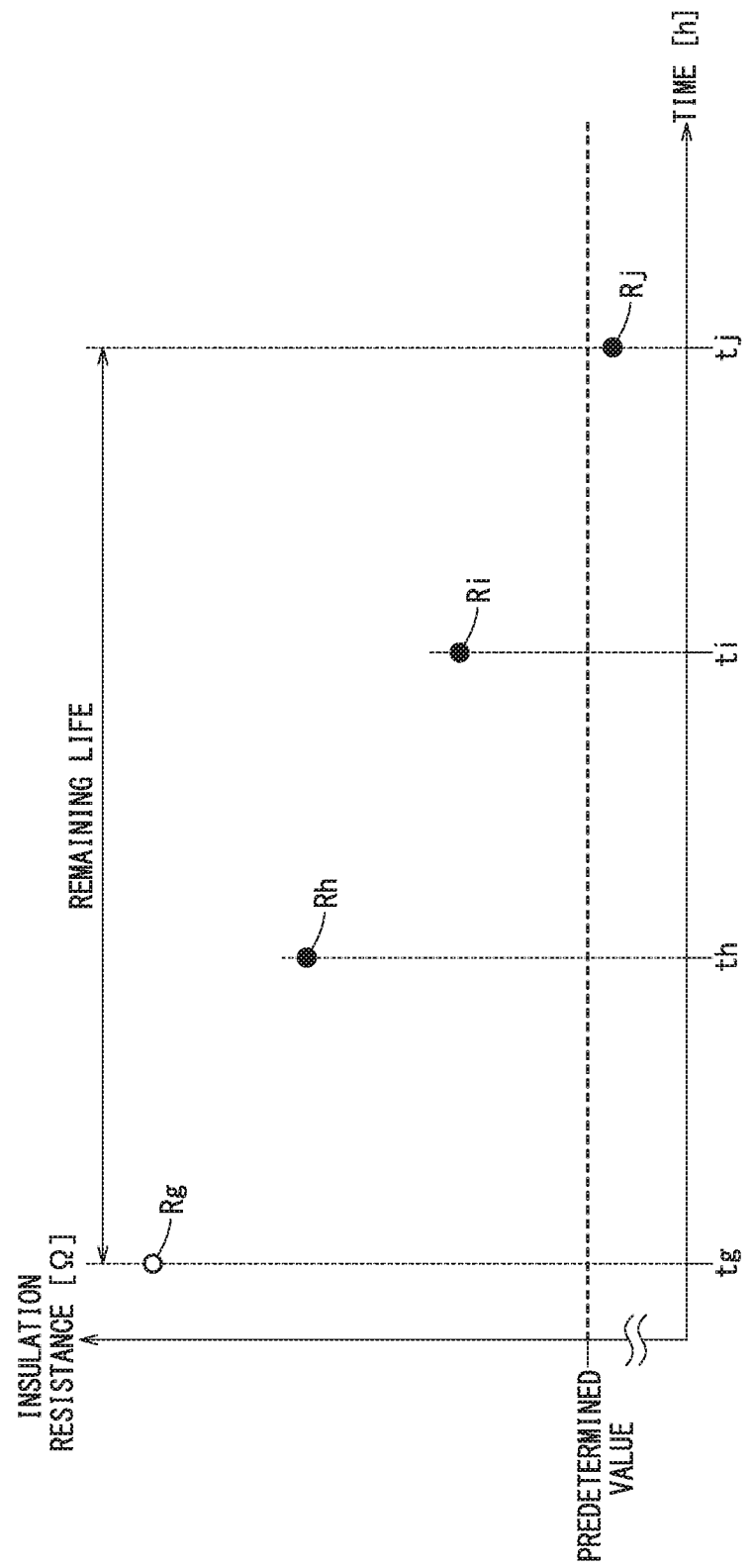

MACHINE LEARNING DEVICE, LEARNING MODEL GENERATING METHOD, INSULATION RESISTANCE ESTIMATING DEVICE, AND CONTROL DEVICE

CROSS-REFERENCE TO RELATED APPLICATION

This application is based upon and claims the benefit of priority from Japanese Patent Application No. 2019-164313 filed on Sep. 10, 2019, the contents of which are incorporated herein by reference.

BACKGROUND OF THE INVENTION

Field of the Invention

The present invention relates to a machine learning device, a learning model generating method, an insulation resistance estimating device, and a control device.

Description of the Related Art

Conventionally, there are techniques for performing diagnosis of motor insulation deterioration (e.g., Japanese Laid-Open Patent Publication No. 2009-060767).

SUMMARY OF THE INVENTION

However, there is room for improvement in accuracy of conventional motor insulation deterioration diagnoses.

The present invention has been devised to solve the problem above, and an object of the present invention is to provide a machine learning device for generating a learning model enabling estimation of the insulation resistance of a servomotor with enhanced accuracy, such a learning model generating method, an insulation resistance estimating device capable of estimating the insulation resistance of a servomotor with enhanced accuracy, and a control device.

According to a first aspect of the present invention, there is provided a learning model generating method of generating a learning model for estimating a ground insulation resistance of a servomotor. The learning model generating method includes: acquiring multiple pieces of training data each including the insulation resistance of the servomotor at a beginning of a certain period, time-series data indicating a condition of the servomotor in the certain period, and the insulation resistance of the servomotor at an end of the certain period; and performing a supervised learning using the training data to thereby generate the learning model that outputs the insulation resistance of the servomotor at an end of another certain period that is different from the certain period, in accordance with the insulation resistance of the servomotor at a beginning of the another certain period and time-series data indicating the condition of the servomotor in the another certain period.

According to a second aspect of the present invention, there is provided a machine learning device for generating a learning model configured to estimate a ground insulation resistance of a servomotor. The machine learning device includes a processing device configured to execute the learning model generating method according to the first aspect above.

According to a third aspect of the present invention, there is provided an insulation resistance estimating device configured to estimate a ground insulation resistance of a servomotor. The insulation resistance estimating device includes: a storage unit configured to store a learning model that has been generated by acquiring multiple pieces of training data and executing a supervised learning using the training data, wherein each piece of the training data includes the insulation resistance of the servomotor at a beginning of a certain period, time-series data indicating a condition of the servomotor in the certain period, and the insulation resistance of the servomotor at an end of the certain period; an acquisition unit configured to acquire the insulation resistance of the servomotor at a beginning of another certain period that is different from the certain period; an estimating unit configured to estimate time-series data indicating the condition of the servomotor in the another certain period; and a processing unit configured to output the insulation resistance of the servomotor at an end of the another certain period, using the learning model stored in the storage unit, and in accordance with the acquired insulation resistance of the servomotor at the beginning of the another certain period and the time-series data indicating the condition of the servomotor in the another certain period.

According to a fourth aspect of the present invention, there is provided a control device for controlling an industrial machine. The control device includes the insulation resistance estimating device described above. According to the present invention, it is possible to enhance the accuracy of estimation of the insulation resistance of a servomotor.

The above and other objects, features, and advantages of the present invention will become more apparent from the following description when taken in conjunction with the accompanying drawings, in which a preferred embodiment of the present invention is shown by way of illustrative example.

BRIEF DESCRIPTION OF THE DRAWINGS

FIG. 2 is a block diagram illustrating the configuration of the machine learning device;

FIG. 3 is a flowchart illustrating a process performed in the machine learning device;

FIG. 5 is a block diagram illustrating the configuration of the insulation resistance estimating device;

FIG. 6 is a flowchart illustrating a process performed in the insulation resistance estimating device;

FIG. 10 is a flowchart illustrating a process performed in the remaining life notification device; and FIG. 11 is a graph used to explain the remaining life.

DESCRIPTION OF THE PREFERRED EMBODIMENTS

First Embodiment

Figure 1:
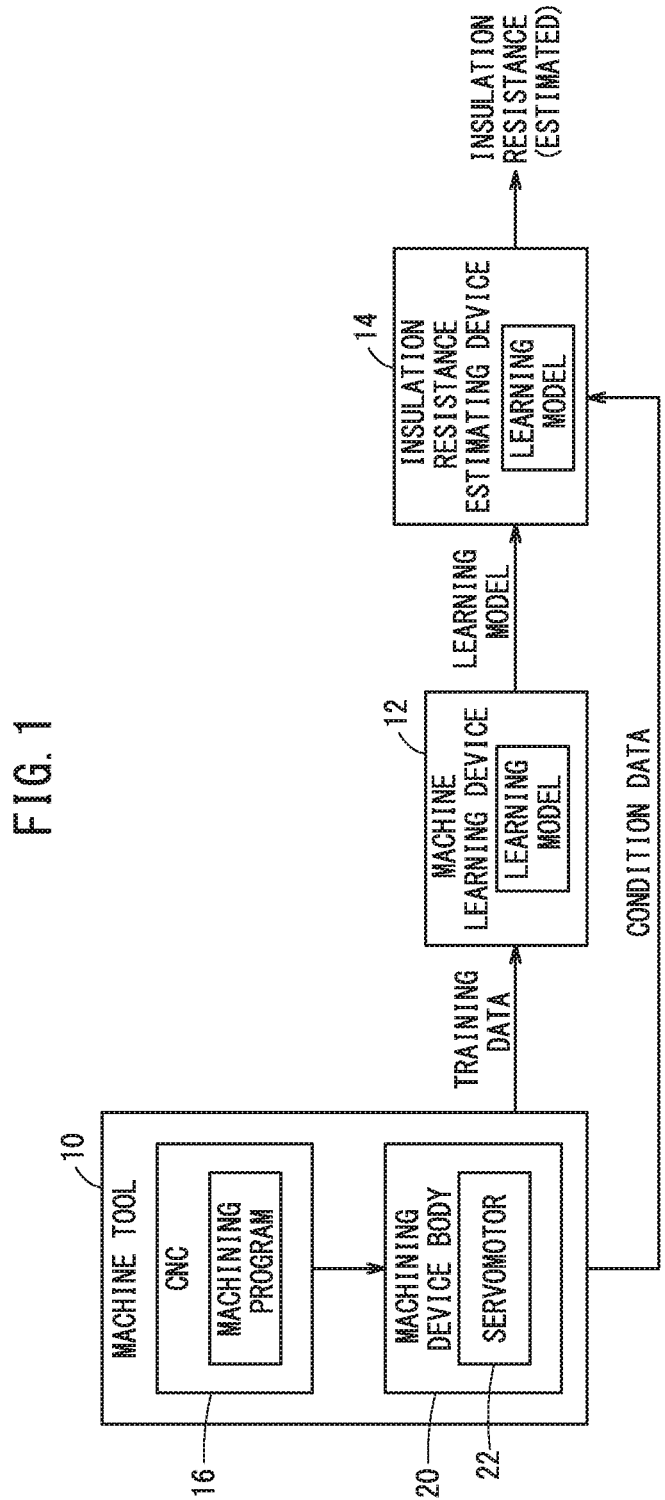
FIG. 1 is a block diagram illustrating a machine tool, a machine learning device, and an insulation resistance estimating device.

FIG. 1 is a block diagram illustrating a machine tool 10, a machine learning device 12, and an insulation resistance estimating device 14.

The machine tool 10 includes a numerical control device (hereinafter referred to as CNC) 16 and a machining device body 20. The CNC 16 controls the machining device body 20 according to a machining program. The machining device body 20 includes a servomotor 22 as a motor for a feed axis, where the servomotor 22 is controlled by the CNC 16 according to the machining program.

The machine learning device 12 is a device for generating a learning model that is used to estimate the insulation resistance of the servomotor 22 in the insulation resistance estimating device 14. The machine learning device 12 receives input data concerning conditions of the servomotor 22 as training data, and performs supervised learning based on the input training data to thereby generate a learning model.

The insulation resistance estimating device 14 estimates future ground insulation resistance of the servomotor 22 using the learning model generated by the machine learning in the machine learning device 12 and condition data concerning conditions of the servomotor 22.

This embodiment will describe the machine learning device 12 that generates a learning model used to estimate the insulation resistance of the servomotor 22 of the machine tool 10 and the insulation resistance estimating device 14 that estimates the insulation resistance of the servomotor 22 of the machine tool 10 using the generated learning model. However, the servomotor 22 is not limited to those used in the machine tool 10, but may be ones used in other industrial machines such as electric discharge machines, injection molding machines, robots, and so forth.

[Machine Learning Device]

FIG. 2 is a block diagram illustrating a configuration of the machine learning device 12. The machine learning device 12 includes a training data acquisition unit 24 and a learning model generating unit 26. The training data acquisition unit 24 includes a beginning-of-period data acquisition unit 28, a time-series data acquisition unit 30, and a label acquisition unit 32.

The machine learning device 12 is a computer having a processing device (processor) such as a CPU, GPU, etc., a main memory device, a storage, and wired or wireless communication means. The beginning-of-period data acquisition unit 28, the time-series data acquisition unit 30, and the label acquisition unit 32 of the training data acquisition unit 24, and the learning model generating unit 26, are realized as the processing device executes a given program.

FIG. 3 is a flowchart illustrating a process performed in the machine learning device 12. Now, the process performed in the machine learning device 12 will be described based on an example in which a learning model is generated by using, as training data (supervised data), data concerning conditions of the servomotor 22 in a period ΔTa from time ta to time tb.

Figure 4A:
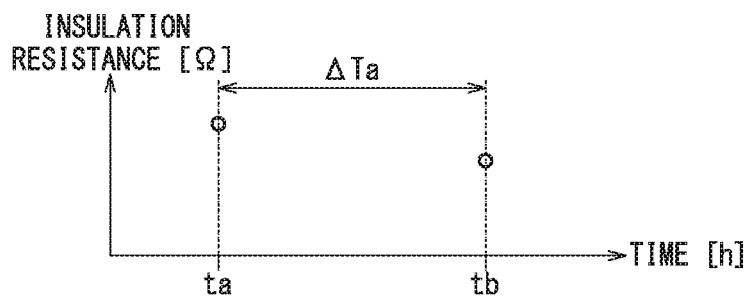
FIGS. 4A, 4B, 4C, 4D, and 4E are graphs showing data concerning conditions of a servomotor that is acquired as training data in a training data acquisition unit.
Figure 4B:
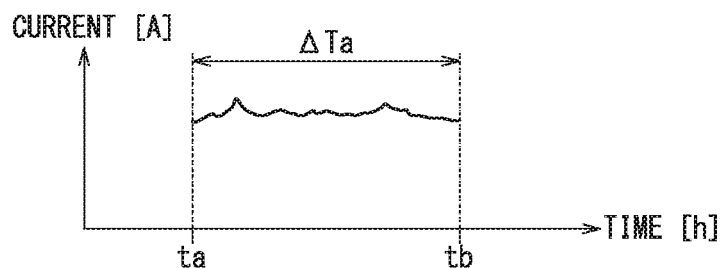
Figure 4C:
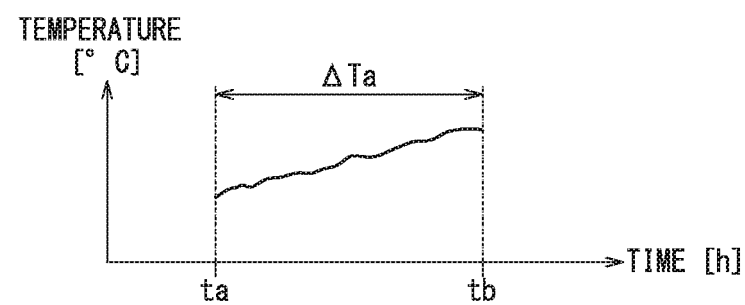
Figure 4D:
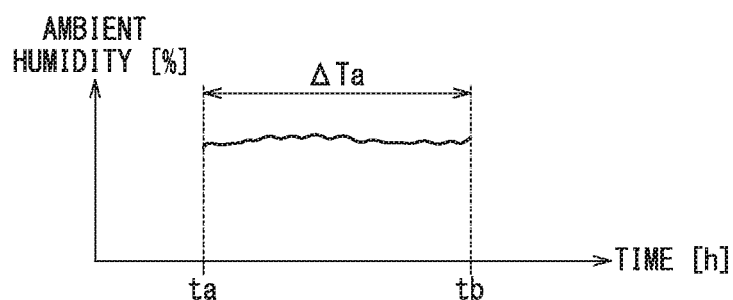
Figure 4E:
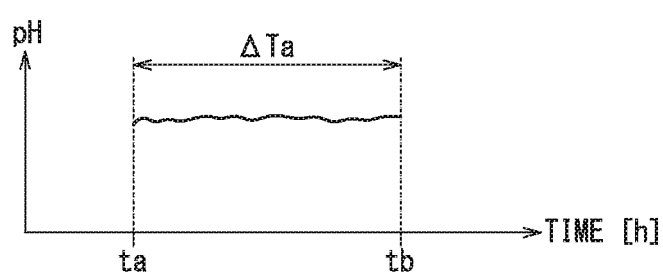

FIGS. 4A, 4B, 4C, 4D, and 4E are graphs illustrating the data concerning conditions of the servomotor 22 that are acquired as training data in the training data acquisition unit 24. FIG. 4A is a graph showing the insulation resistances of the servomotor 22 at the beginning (time ta) and the end (time tb) of the period ΔTa. FIG. 4B is a graph showing time-series data on an electric current supplied to the servomotor 22 in the period ΔTa. FIG. 4C is a graph showing time-series data on a temperature of the servomotor 22 in the period ΔTa. FIG. 4D is a graph showing time-series data on an ambient humidity of the servomotor 22 in the period ΔTa. FIG. 4E is a graph showing time-series data on a condition (pH) of cutting fluid used in the machining device body 20 in the period ΔTa.

At step S1, the beginning-of-period data acquisition unit 28 acquires the insulation resistance of the servomotor 22 at the beginning (time ta) of the period ΔTa and then moves to step S2. The insulation resistance of the servomotor 22 is an absolute resistance to ground that is measured when the machining device body 20 is in an emergency stop, i.e., when no electricity is being supplied to a servo amplifier (not shown).

At step S2, the time-series data acquisition unit 30 acquires time-series data on an electric current supplied to the servomotor 22 in the period ΔTa and then moves to step S3.

At step S3, the time-series data acquisition unit 30 acquires time-series data on a temperature of the servomotor 22 in the period ΔTa and then moves to step S4. Incidentally, the temperature of the servomotor 22 may be acquired at any position as long as it is a temperature inside the housing of the servomotor 22, but it is desirable that the temperature be acquired at a position where the temperature varies depending on the load on the servomotor 22.

At step S4, the time-series data acquisition unit 30 acquires time-series data on an ambient humidity of the servomotor 22 in the period ΔTa and then moves to step S5. The ambient humidity of the servomotor 22 may be acquired at any position as long as it is a humidity outside of the housing of the servomotor 22, but it is desirable that the humidity be acquired at a position as close as possible to the servomotor 22.

At step S5, the time-series data acquisition unit 30 acquires time-series data on a condition (pH) of the cutting fluid used in the machining device body 20 in the period ΔTa and then moves to step S6.

At step S6, the label acquisition unit 32 acquires the insulation resistance of the servomotor 22 at the end (time tb) of the period ΔTa and then moves to step S7.

At step S7, the learning model generating unit 26 generates a learning model from the training data acquired in the training data acquisition unit 24, using an existing machine learning algorithm. The machine learning algorithm is not particularly limited as long as it can adopt a regression method.

At step S8, the learning model generating unit 26 determines whether to end the machine learning. If the machine learning is to be ended, the process in the machine learning device 12 is terminated. If the machine learning is not to be ended, the process returns to step S1. The determination that the machine learning should be ended is made if some condition has been met, e.g., if the machine learning has been repeated a predetermined number of times.

The training data acquisition unit 24 acquires many pieces of training data from the machine tool 10. The training data acquisition unit 24 may acquire the training data from the machine tool 10 in real time, or may acquire previously prepared training data. Further, the training data acquisition unit 24 may acquire training data from one machine tool 10 or may acquire training data from multiple machine tools 10 through a network.

The training data acquisition unit 24 acquires, as the training data, time-series data concerning conditions of the servomotor 22 in a certain period, but the time-series data is not limited to those described above. As the training data, it may acquire part of the electric current supplied to the servomotor 22, the temperature of the servomotor 22, the ambient humidity of the servomotor 22, and the condition (pH) of the cutting fluid used in the machining device body 20. Further, as the condition of the cutting fluid used in the machining device body 20, the water content contained in the cutting fluid and the like may be used in placed of or in addition to the pH of the cutting fluid.

The learning model generating unit 26 may generate a learning model for each machining program executed by the CNC 16. Alternatively, the learning model generating unit 26 may generate a general-purpose learning model regardless of the machining program. Further, the learning model may be generated based on one unit period being defined by a period from the beginning of machining of one product to the end of the machining, or one unit period being defined by a period from the beginning of machining of a given number of products to the end of the machining. Moreover, the learning model may be generated based on one unit period having a given length (e.g., one month).

[Insulation Resistance Estimating Device]

The insulation resistance estimating device 14 estimates a future insulation resistance of the servomotor 22 at a future time that is after a certain period has passed from the present time, by using the present insulation resistance of the servomotor 22 and time-series data concerning the conditions of the servomotor 22 in the past.

FIG. 5 is a block diagram illustrating a configuration of the insulation resistance estimating device 14. The insulation resistance estimating device 14 includes a present data acquisition unit 34, a time-series data estimating unit 36, a storage unit 38, and a processing unit 40.

The insulation resistance estimating device 14 is a computer having a processing device (processor) such as a CPU, GPU, etc., a main memory device, a storage, and wired or wireless communication means. The present data acquisition unit 34, the time-series data estimating unit 36, and the processing unit 40 are realized as the processing device executes a given program. The storage unit 38 may be a storage in the insulation resistance estimating device 14, or may be provided in the cloud, as long as it is a non-transitory tangible computer-readable storage medium.

FIG. 6 is a flowchart illustrating a process performed in the insulation resistance estimating device 14. The process performed in the insulation resistance estimating device 14 will be described based on an example in which the insulation resistance estimating device 14 estimates the insulation resistance of the servomotor 22 at time tf that is after a certain period ΔTc has passed from the present time (time te).

Figure 7A:
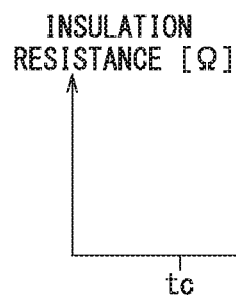
FIG. 7A is a graph illustrating data concerning a condition of the servomotor that is acquired in a present data acquisition unit.
Figure 7B:
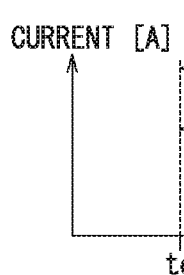
FIGS. 7B, 7C, 7D, and 7E are graphs showing data concerning conditions of the servomotor that is estimated in a time-series data estimating unit.
Figure 7C:
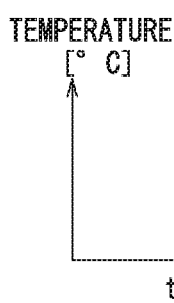
Figure 7D:
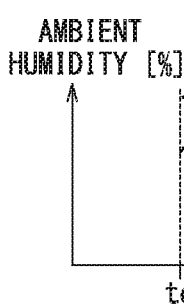
Figure 7E:
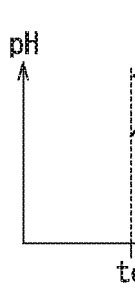

FIG. 7A is a graph showing data concerning a condition of the servomotor 22 acquired in the present data acquisition unit 34. FIGS. 7B, 7C, 7D, and 7E are graphs showing data concerning conditions of the servomotor 22 that is estimated in the time-series data estimating unit 36. FIG. 7A is a graph showing the insulation resistance of the servomotor 22 at the present time te. FIG. 7B is a graph showing time-series data on the electric current supplied to the servomotor 22 in a past period ΔTb (time tc to time td), and time-series data in the period ΔTc that has been estimated from the time-series data in the period ΔTb. FIG. 7C is a graph showing time-series data on the temperature of the servomotor 22 in the past period ΔTb and time-series data in the period ΔTc estimated from the time-series data in the period ΔTb. FIG. 7D is a graph showing time-series data on the ambient humidity of the servomotor 22 in the past period ΔTb and time-series data in the period ΔTc estimated from the time-series data in the period ΔTb. FIG. 7E is a graph showing time-series data on the condition (pH) of the cutting fluid used in the machining device body 20 in the past period ΔTb and time-series data in the period ΔTc estimated from the time-series data in the period ΔTb.

At step S11, the present data acquisition unit 34 acquires the present insulation resistance of the servomotor 22 and then moves to step S12.

At step S12, the time-series data estimating unit 36 estimates the time-series data on the electric current supplied to the servomotor 22 in the period ΔTc from the time-series data on the electric current supplied to the servomotor 22 in the past period ΔTb, and then moves to step S13.

At step S13, the time-series data estimating unit 36 estimates the time-series data on the temperature of the servomotor 22 in the period ΔTc from the time-series data on the temperature of the servomotor 22 in the past period ΔTb, and then moves to step S14.

At step S14, the time-series data estimating unit 36 estimates the time-series data on the ambient humidity of the servomotor 22 in the period ΔTc from the time-series data on the ambient humidity of the servomotor 22 in the past period ΔTb, and then moves to step S15.

At step S15, the time-series data estimating unit 36 estimates the time-series data on the condition (pH) of the cutting fluid used in the machining device body 20 in the period ΔTc from the time-series data on the condition (pH) of the cutting fluid used in the machining device body 20 in the past period ΔTb, and then moves to step S16.

At step S16, the processing unit 40 estimates the insulation resistance of the servomotor 22 at time tf that is after the given period ΔTc has passed after the present time (time te), using the acquired data pieces and the stored learning model, and then terminates the process in the insulation resistance estimating device 14.

As to the individual pieces of time-series data estimated by the time-series data estimating unit 36, the time-series data acquired when the CNC 16 executed a machining program to thereby control the machining device body 20 in the past period ΔTb may be used as the time-series data at the time when the CNC 16 executes the same machining program to thereby control the machining device body 20 in the future period ΔTc. If a machining program that has not been executed in the past by the CNC 16 is executed in the future period ΔTc by the CNC 16, then the time-series data may be newly acquired by causing the CNC 16 to execute the machining program not executed in the past.

[Functions and Effects]

The machine learning device 12 of this embodiment generates a learning model by using, as training data, the insulation resistances of the servomotor 22 at the beginning and the end of a certain period and the time-series data concerning conditions of the servomotor 22 in the certain period. The machine learning device 12 can thus generate a learning model capable of highly accurately estimating the insulation resistance of the servomotor 22.

Further, the insulation resistance estimating device 14 of this embodiment estimates the insulation resistance of the servomotor 22 by using the learning model that has been generated using, as training data, the insulation resistances of the servomotor 22 at the beginning and the end of a certain period and the time-series data concerning conditions of the servomotor 22 in the certain period. The insulation resistance estimating device 14 can thus highly accurately estimate the insulation resistance of the servomotor 22.

Second Embodiment

Figure 8:
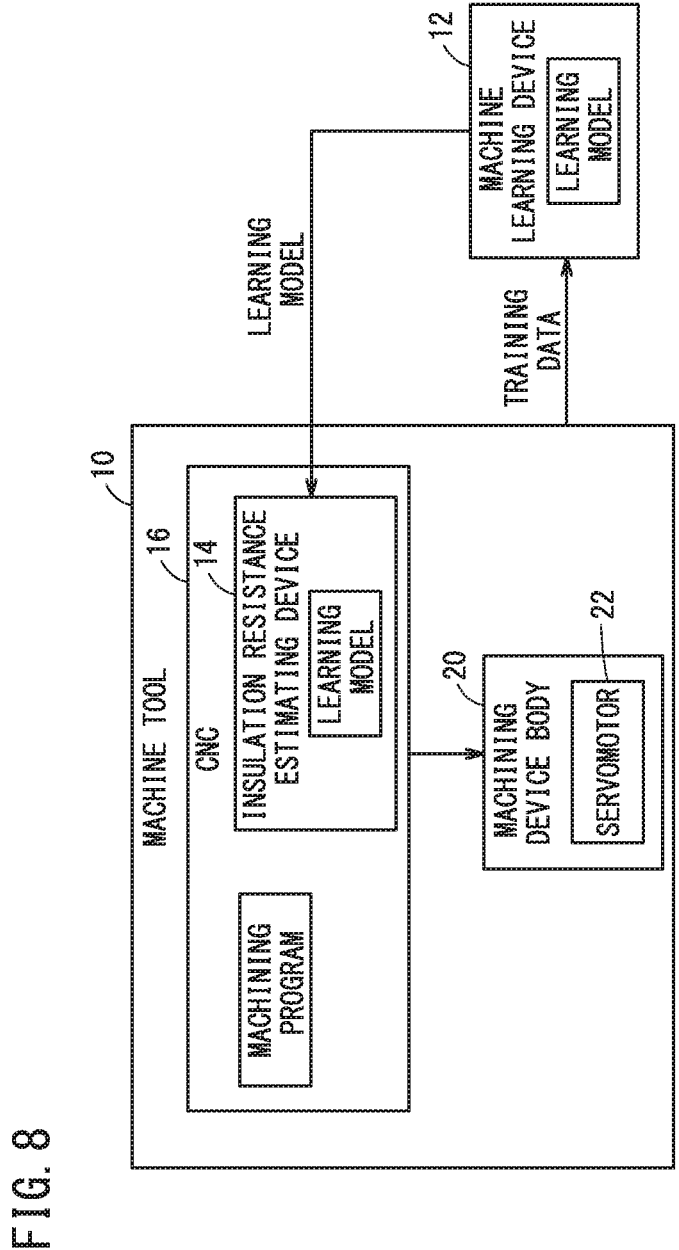
FIG. 8 is a block diagram illustrating a machine tool and a machine learning device.

FIG. 8 is a block diagram illustrating a machine tool 10 and a machine learning device 12. A second embodiment differs from the first embodiment in that the CNC 16 of the machine tool 10 includes the insulation resistance estimating device 14. The configuration and details are the same as those of the first embodiment in other respects.

[Functions and Effects]

The CNC 16 of this embodiment includes the insulation resistance estimating device 14. This enables the CNC 16 to highly accurately estimate the insulation resistance of the servomotor 22.

Third Embodiment

Figure 9:
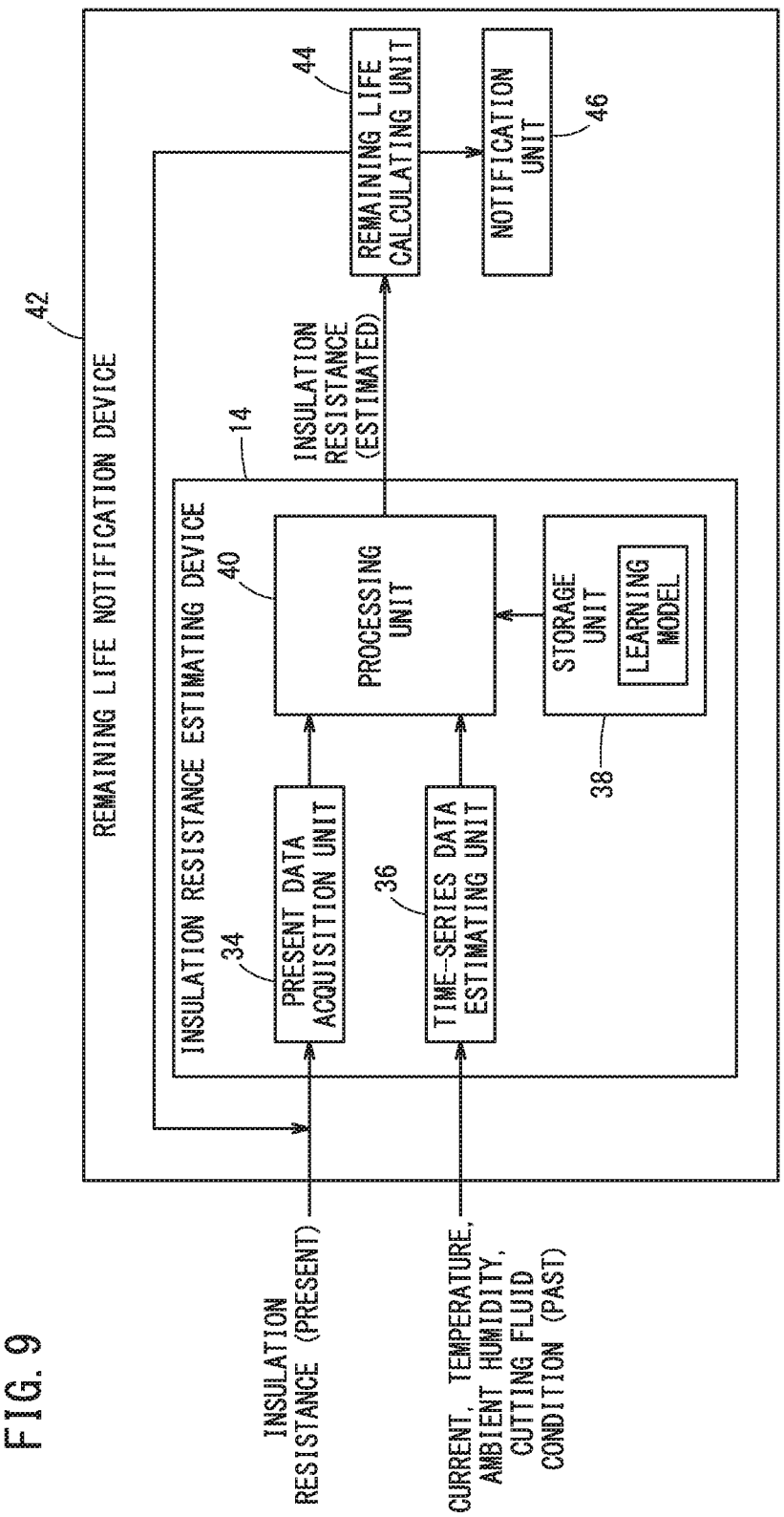
FIG. 9 is a block diagram of a remaining life notification device.

FIG. 9 is a block diagram of a remaining life notification device 42. The remaining life notification device 42 includes the insulation resistance estimating device 14, and calculates the remaining life (remaining life-time) of the servomotor 22 based on the insulation resistance of the servomotor 22 estimated by the insulation resistance estimating device 14 and notifies the calculated remaining life.

In addition to the insulation resistance estimating device 14, the remaining life notification device 42 further includes a remaining life calculating unit 44 and a notification unit 46. The remaining life calculating unit 44 calculates the remaining life of the servomotor 22 on the basis of the insulation resistance of the servomotor 22 estimated by the insulation resistance estimating device 14. The notification unit 46 is a display device, an audio output device, or the like, which notifies the operator of the remaining life by means of text, image, voice, etc. The configuration and other details of the insulation resistance estimating device 14 are the same as those of the insulation resistance estimating device 14 of the first embodiment.

The remaining life notification device 42 is a computer including a processing device (processor) like a CPU, GPU, etc., a main memory device, a storage, and wired or wireless communication means. The present data acquisition unit 34, time-series data estimating unit 36, and processing unit 40 of the insulation resistance estimating device 14, and the remaining life calculating unit 44, are realized as the processing device executes a given program. The storage unit 38 may be a storage in the insulation resistance estimating device 14, or may be provided in the cloud, as long as it is a non-transitory tangible computer-readable storage medium.

FIG. 10 is a flowchart illustrating a process performed in the remaining life notification device 42.

At step S21, the remaining life calculating unit 44 acquires the insulation resistance of the servomotor 22 estimated in the insulation resistance estimating device 14 and then moves to step S22.

At step S22, the remaining life calculating unit 44 determines whether the acquired insulation resistance of the servomotor 22 is less than a predetermined value. If the insulation resistance of the servomotor 22 is less than the predetermined value, the process moves to step S23. The process moves to step S24 if the insulation resistance of the servomotor 22 is not less than the predetermined value.

If the acquired insulation resistance of the servomotor 22 is less than the predetermined value, then at step S23, the remaining life calculating unit 44 sends to the insulation resistance estimating device 14 the insulation resistance of the servomotor 22 acquired at step S21, and returns to step S21. The insulation resistance estimating device 14 estimates the insulation resistance of the servomotor 22 in a more distant future by using the insulation resistance of the servomotor 22 sent from the remaining life calculating unit 44.

If the insulation resistance of the servomotor 22 is not less than the predetermined value, then at step S24, the remaining life calculating unit 44 calculates the remaining life and then moves to step S25.

At step S25, the remaining life calculating unit 44 controls the notification unit 46 in order to give notification of the remaining life, and terminates the process performed in the remaining life notification device 42.

FIG. 11 is a graph to explain the remaining life. The insulation resistance estimating device 14 estimates a future insulation resistance (insulation resistance Rh) of the servomotor 22 at a future time (time th) on the basis of the present insulation resistance (insulation resistance Rg) of the servomotor 22 at the present time (time tg). Next, based on the estimated insulation resistance (insulation resistance Rh) of the servomotor 22 at time th, the insulation resistance estimating device 14 estimates a further future insulation resistance (insulation resistance Ri) of the servomotor 22 at a more distant future time (time ti). The insulation resistance estimating device 14 repeats the operation of estimating a further future insulation resistance of the servomotor 22 on the basis of the estimated insulation resistance of the servomotor 22, thereby estimating the insulation resistance of the servomotor 22 at a desired future time.

The remaining life calculating unit 44 calculates, as the remaining life, a time span from the present time tg to the future time tj at which the estimated insulation resistance Rj becomes less than the predetermined value.

[Functions and Effects]

The remaining life notification device 42 of this embodiment calculates the remaining life of the servomotor 22 on the basis of the insulation resistance estimated by the insulation resistance estimating device 14. This enables the remaining life notification device 42 to highly accurately calculate the remaining life of the servomotor 22.

[Technical Idea Obtained from Embodiments]

The technical idea graspable from the embodiments described above will be recited below.

The learning model generating method is provided which generates a learning model for estimating a ground insulation resistance of a servomotor (22). The learning model generating method includes: acquiring multiple pieces of training data each including the insulation resistance of the servomotor at the beginning of a certain period, time-series data indicating conditions of the servomotor in the certain period, and the insulation resistance of the servomotor at the end of the certain period; and performing a supervised learning using the training data to thereby generate a learning model that outputs the insulation resistance of the servomotor at the end of another certain period that is different from the certain period, in accordance with the insulation resistance of the servomotor at the beginning of the another certain period and time-series data indicating the conditions of the servomotor in the another certain period. It is thus possible to generate a learning model capable of highly accurately estimating the insulation resistance of the servomotor.

In the learning model generating method above, the time-series data includes an electric current supplied to the servomotor. A learning model can thus be generated which can highly accurately estimate the insulation resistance of the servomotor.

In the learning model generating method above, the time-series data includes an electric current supplied to the servomotor and a temperature of the servomotor. A learning model can thus be generated which can highly accurately estimate the insulation resistance of the servomotor.

In the learning model generating method above, the time-series data includes an electric current supplied to the servomotor, a temperature of the servomotor, and an ambient humidity of the servomotor. A learning model can thus be generated which can highly accurately estimate the insulation resistance of the servomotor.

In the learning model generating method above, the time-series data includes an electric current supplied to the servomotor, a temperature of the servomotor, an ambient humidity of the servomotor, and a value indicating a condition of a cutting fluid. A learning model can thus be generated which can highly accurately estimate the insulation resistance of the servomotor.

The machine learning device (12) for generating a learning model configured to estimate a ground insulation resistance of a servomotor includes a processing device that executes the learning model generating method above. The machine learning device can thus generate a learning model that can highly accurately estimate the insulation resistance of the servomotor (22).

The insulation resistance estimating device (14) is configured to estimate the ground insulation resistance of a servomotor. The insulation resistance estimating device (14) includes: a storage unit (38) configured to store a learning model that has been generated by acquiring multiple pieces of training data and executing a supervised learning using the training data, wherein each piece of the training data includes the insulation resistance of the servomotor at the beginning of a certain period, time-series data indicating conditions of the servomotor in the certain period, and the insulation resistance of the servomotor at the end of the certain period; an acquisition unit (34) configured to acquire the insulation resistance of the servomotor at the beginning of another certain period that is different from the certain period; an estimating unit (36) configured to estimate time-series data indicating the conditions of the servomotor in the another certain period; and a processing unit (40) configured to output the insulation resistance of the servomotor at the end of the another certain period, using the learning model stored in the storage unit, and in accordance with the acquired insulation resistance of the servomotor at the beginning of the another certain period and the time-series data indicating the conditions of the servomotor in the another certain period. The insulation resistance estimating device can thus highly accurately estimate the insulation resistance of the servomotor.

The control device (16) for controlling an industrial machine includes the insulation resistance estimating device above. The control device can thus highly accurately estimate the insulation resistance of the servomotor.

The present invention is not particularly limited to the embodiment described above, and various modifications are possible without departing from the essence and gist of the present invention.

What is claimed is:

1. A learning model generating method of generating a learning model configured to estimate a ground insulation resistance of a servomotor, comprising:
   acquiring multiple pieces of training data each including the insulation resistance of the servomotor at a beginning of a certain period, time-series data indicating a condition of the servomotor in the certain period, and the insulation resistance of the servomotor at an end of the certain period; and
   performing a supervised learning using the training data to thereby generate the learning model configured to output the insulation resistance of the servomotor at an end of another certain period that is different from the certain period, in accordance with the insulation resistance of the servomotor at a beginning of the another certain period and time-series data indicating the condition of the servomotor in the another certain period.

2. The learning model generating method according to claim 1, wherein the time-series data includes an electric current supplied to the servomotor.

3. The learning model generating method according to claim 1, wherein the time-series data includes an electric current supplied to the servomotor and a temperature of the servomotor.

4. The learning model generating method according to claim 1, wherein the time-series data includes an electric current supplied to the servomotor, a temperature of the servomotor, and an ambient humidity of the servomotor.

5. The learning model generating method according to claim 1, wherein the time-series data includes an electric current supplied to the servomotor, a temperature of the servomotor, an ambient humidity of the servomotor, and a value indicating a condition of a cutting fluid.

6. A machine learning device for generating a learning model configured to estimate a ground insulation resistance of a servomotor, comprising a processing device configured to execute the learning model generating method according to claim 1.

7. An insulation resistance estimating device configured to estimate a ground insulation resistance of a servomotor, comprising:
   a processor;
   a memory having instructions stored thereon, which when executed by the processor, cause the insulation resistance estimating device to:
   store a learning model that has been generated by acquiring multiple pieces of training data and executing a supervised learning using the training data, wherein each piece of the training data includes the insulation resistance of the servomotor at a beginning of a certain period, time-series data indicating a condition of the servomotor in the certain period, and the insulation resistance of the servomotor at an end of the certain period;
   acquire the insulation resistance of the servomotor at a beginning of another certain period that is different from the certain period;
   estimate time-series data indicating the condition of the servomotor in the another certain period; and
   output the insulation resistance of the servomotor at an end of the another certain period, using the stored learning model, and in accordance with the acquired insulation resistance of the servomotor at the beginning of the another certain period and the time-series data indicating the condition of the servomotor in the another certain period.

8. The insulation resistance estimating device of claim 7, wherein the instructions, when executed by the processor, cause the insulation resistance estimating device to control an industrial machine.

* * * * *